(12) United States Patent
Bernas et al.

(10) Patent No.: US 6,764,619 B2
(45) Date of Patent: Jul. 20, 2004

(54) SOLID FREEFORM FABRICATION OF LIGHTWEIGHT LITHOGRAPHY STAGE

(75) Inventors: James J. Bernas, Horseheads, NY (US); Bradley F. Bowden, Alfred, NY (US); Kenneth E. Hrdina, Horseheads, NY (US); John F. Wight, Jr., Corning, NY (US)

(73) Assignee: Corning Incorporated, Corning, NY (US)

( * ) Notice: Subject to any disclaimer, the term of this patent is extended or adjusted under 35 U.S.C. 154(b) by 256 days.

(21) Appl. No.: 10/001,346

(22) Filed: Oct. 31, 2001

(65) Prior Publication Data

US 2002/0154280 A1 Oct. 24, 2002

Related U.S. Application Data

(60) Provisional application No. 60/268,427, filed on Feb. 13, 2001.

(51) Int. Cl.[7] .............................. G02B 1/00; B28B 7/22
(52) U.S. Cl. ...................... 264/1.21; 264/255; 264/642; 264/669; 264/604; 65/17.3
(58) Field of Search ............................... 264/1.21, 255, 264/642, 669, 604; 65/17.3

(56) References Cited

U.S. PATENT DOCUMENTS

| | | | |
|---|---|---|---|
| 5,204,055 A | * | 4/1993 | Sachs et al. .................... 419/2 |
| 5,301,415 A | * | 4/1994 | Prinz et al. .................... 29/458 |
| 5,387,380 A | | 2/1995 | Cima et al. |
| 5,479,257 A | | 12/1995 | Hashimoto |
| 5,530,257 A | | 6/1996 | Mizutani et al. |
| 5,623,853 A | | 4/1997 | Novak et al. |
| 5,699,621 A | | 12/1997 | Trumper et al. |
| 5,807,437 A | | 9/1998 | Sachs et al. |
| 5,999,254 A | | 12/1999 | Seibert et al. |
| 6,036,777 A | * | 3/2000 | Sachs .......................... 118/56 |
| 6,188,150 B1 | | 2/2001 | Spence |
| 6,375,874 B1 | * | 4/2002 | Russell et al. ................. 264/28 |
| 2001/0028462 A1 | | 10/2001 | Ichihara et al. |

OTHER PUBLICATIONS

"Extreme Ultraviolet Lithography," Gwyn. C., et al., EUV LLC, Nov. 1999, pps. 97–141.
"Three Dimensional Printing," website: http://web.mit.edu/tdp/www/applications.html.

* cited by examiner

*Primary Examiner*—Christopher A. Fiorilla
(74) *Attorney, Agent, or Firm*—Timothy M. Schaeberle; James V. Suggs

(57) ABSTRACT

A method of making an EUV lithography stage structure includes depositing a layer of a Ti doped $SiO_2$ glass powder in a confined region to provide an underlying layer; applying a binder to form a primitive with the binder bonding the glass powder together at one or more selected regions; depositing an above layer of the glass powder above the deposited layer; applying the binder to the above layer with the binder bonding the glass powder together at one or more selected regions; repeating the deposition and binding steps to produce a number of successive layers with the binder bonding the successive layers together; and removing the unbonded glass powder to provide a bonded glass powder lithography stage structure which is then sintered and densified into a densified nonpowder glass lithography stage.

32 Claims, 13 Drawing Sheets

SOLID FREEFORM FABRICATION OF LIGHTWEIGHT LITHOGRAPHY STAGE

This application claims benefit of provisional application No. 60/268,427 filed Feb. 13, 2001.

FIELD OF THE INVENTION

The invention relates to stages for use in projection microlithography. The invention is particularly related to stages for use in projection lithography employing short wavelength radiation. The invention is particularly related to stages for use in extreme ultraviolet (EUV) lithography systems.

BACKGROUND

The use of extreme ultraviolet soft x-ray radiation provides benefits in terms of achieving smaller feature dimensions but due to the nature of the radiation, it presents difficulties in terms of manipulating and directing such wavelengths of radiation and has delayed the commercial lithographic manufacturing use of such radiation.

The present invention provides for an economically manufactured lightweight support stage that is stable and provides an improved extreme ultraviolet soft x-ray based projection lithography method/system. The present invention economically provides for the making of support stages for use in projection lithography method/system to support components of the process such as a mask or wafer. The present invention economically provides for the making of support structure stages for use in extreme ultraviolet soft x-ray based projection lithography method/system to support components and substrates of the process such as optics, reflective members, mirrors, masks or wafers.

Projection lithography is a powerful and essential tool for microelectronics processing and Extreme UltraViolet (EUV) is now at the forefront of research in efforts to achieve smaller and smaller desired feature sizes on wafers. With projection photolithography, a mask is imaged through a reduction-projection lens onto a wafer. Masks for EUV projection lithography typically comprise a substrate coated with an x-ray reflective material and a pattern fabricated from an x-ray absorbing material that is formed on the reflective material. In operation, EUV radiation from the condenser is projected toward the surface of the mask and radiation is reflected from those areas of the mask reflective surface which are exposed, i.e., not covered by the x-ray absorbing material. The reflected radiation effectively transcribes the pattern from the mask to the wafer positioned downstream from the mask. A scanning exposure device uses simultaneous motion of the mask and wafer, with each substrate being mounted on a chuck that is attached to an X-Y stage platen, to continuously project a portion of the mask onto the wafer through projection optics. Scanning, as opposed to exposure of the entire mask at once, allows for the projection of mask patterns that exceed in size that of the image field of the projection lens. Mirrors are mounted along the sides of a stage; and interferometer heads that direct laser beams onto the associated mirrors and detect the beam reflection therefrom are employed for position measuring purposes. Movement of the stage is accomplished with motorized positioning devices. A stage similarly supports the wafer substrate.

SUMMARY OF THE INVENTION

The invention includes a method of making a lithography stage. The method includes providing a Ti doped $SiO_2$ glass powder comprised of a plurality of particles of Ti doped $SiO_2$ glass; providing a binder, said binder for binding said Ti doped $SiO_2$ glass particles together; depositing a layer of said Ti doped $SiO_2$ glass powder in a confined region to provide an underlying layer; applying said binder to one or more selected regions of said layer of Ti doped $SiO_2$ glass powder to bind at least two of said Ti doped $SiO_2$ glass particles together to form a primitive, said applying binder bonding said glass powder together at said one or more selected regions; depositing an above layer of said Ti doped $SiO_2$ glass powder above said deposited layer; applying said binder to one or more selected regions of said above layer with said binder bonding said glass powder together at said one or more selected regions; repeating the steps of depositing an above layer and applying a binder thereto for a selected number of times to produce a selected number of successive layers with said binder bonding said successive layers together; and removing the unbonded glass powder which is not at said one or more selected regions to provide a bonded Ti doped $SiO_2$ glass powder lithography stage structure.

The method includes a method of making a lithography stage. The method include providing a plurality of glass particles; providing a binder, said binder for binding said glass particles together; depositing a layer of said glass particles in a confined region to provide an underlying layer; applying said binder to one or more selected regions of said layer of glass particles to bind at least two of said glass particles together to form a primitive, said applying binder bonding said glass particles together at said one or more selected regions; depositing an above layer of said glass particles above said deposited layer; applying said binder to one or more selected regions of said above layer with said binder bonding said glass particles together at said one or more selected regions; repeating the steps of depositing an above layer and applying a binder thereto for a selected number of times to produce a selected number of successive layers with said binder bonding said successive layers together; removing unbonded glass particles which are not at said one or more selected regions to provide a bonded glass particle lithography stage structure.

The invention includes method of making an EUV lithography structure, said method comprising the following steps: providing a plurality of glass particles; providing a binder, said binder for binding said glass particles together; depositing a layer of said glass particles in a confined region to provide an underlying layer; applying said binder to one or more selected regions of said layer of glass particles to bind at least two of said glass particles together to form a primitive, said applying binder bonding said glass particles together at said one or more selected regions; depositing an above layer of said glass particles above said deposited layer; applying said binder to one or more selected regions of said above layer with said binder bonding said glass particles together at said one or more selected regions; repeating the steps of depositing an above layer and applying a binder thereto for a selected number of times to produce a selected number of successive layers with said binder bonding said successive layers together; removing unbonded glass particles which are not at said one or more selected regions to provide a bonded glass particle EUV lithography structure.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention, and are incorporated in and constitute a part of this specification. The drawings illustrate various embodiments of the invention, and together with the description serve to explain the principals and operation of the invention.

DETAILED DESCRIPTION

Figure 1:
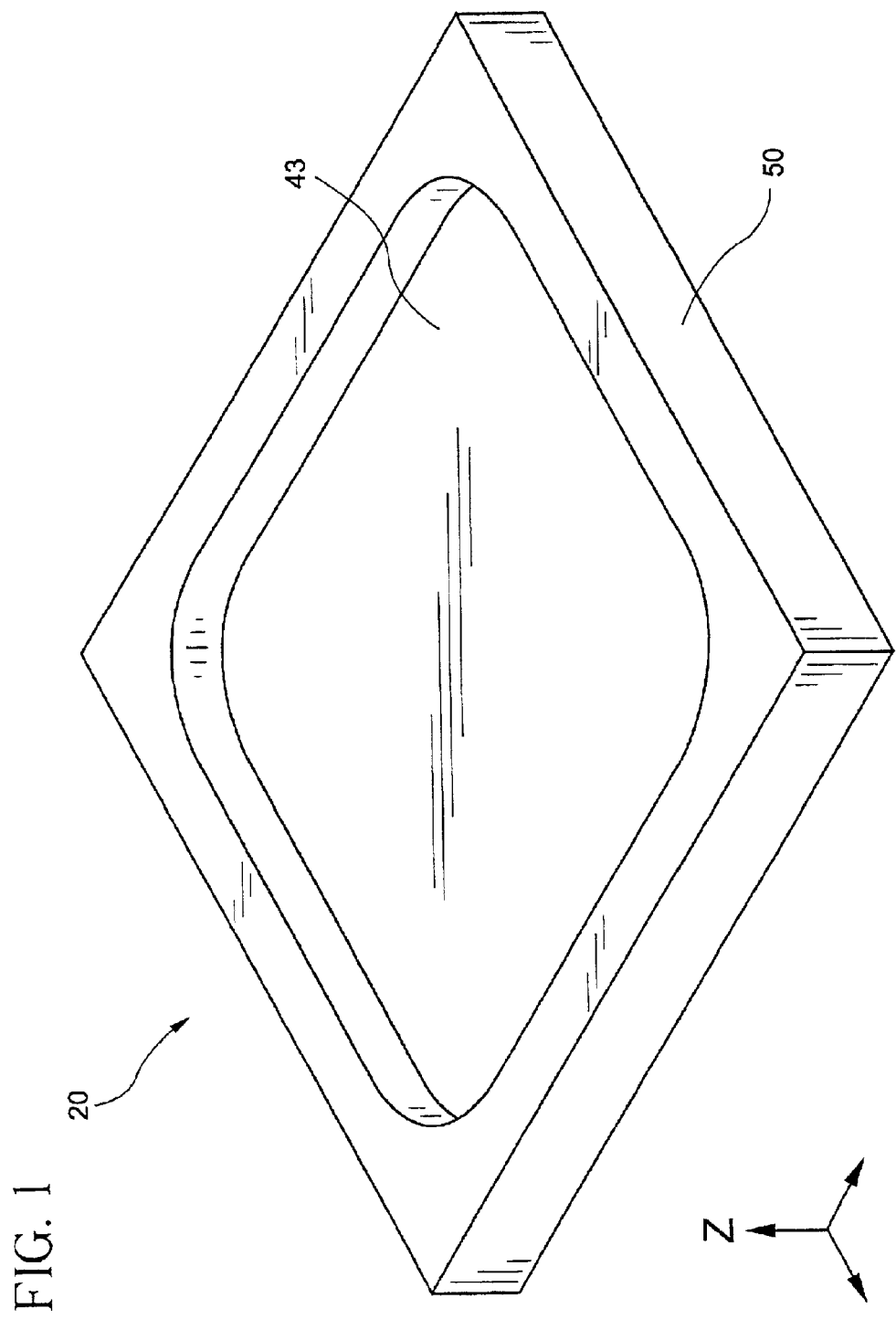
FIG. 1 shows a semiconductor lithography stage in accordance with the invention.
Figure 2:
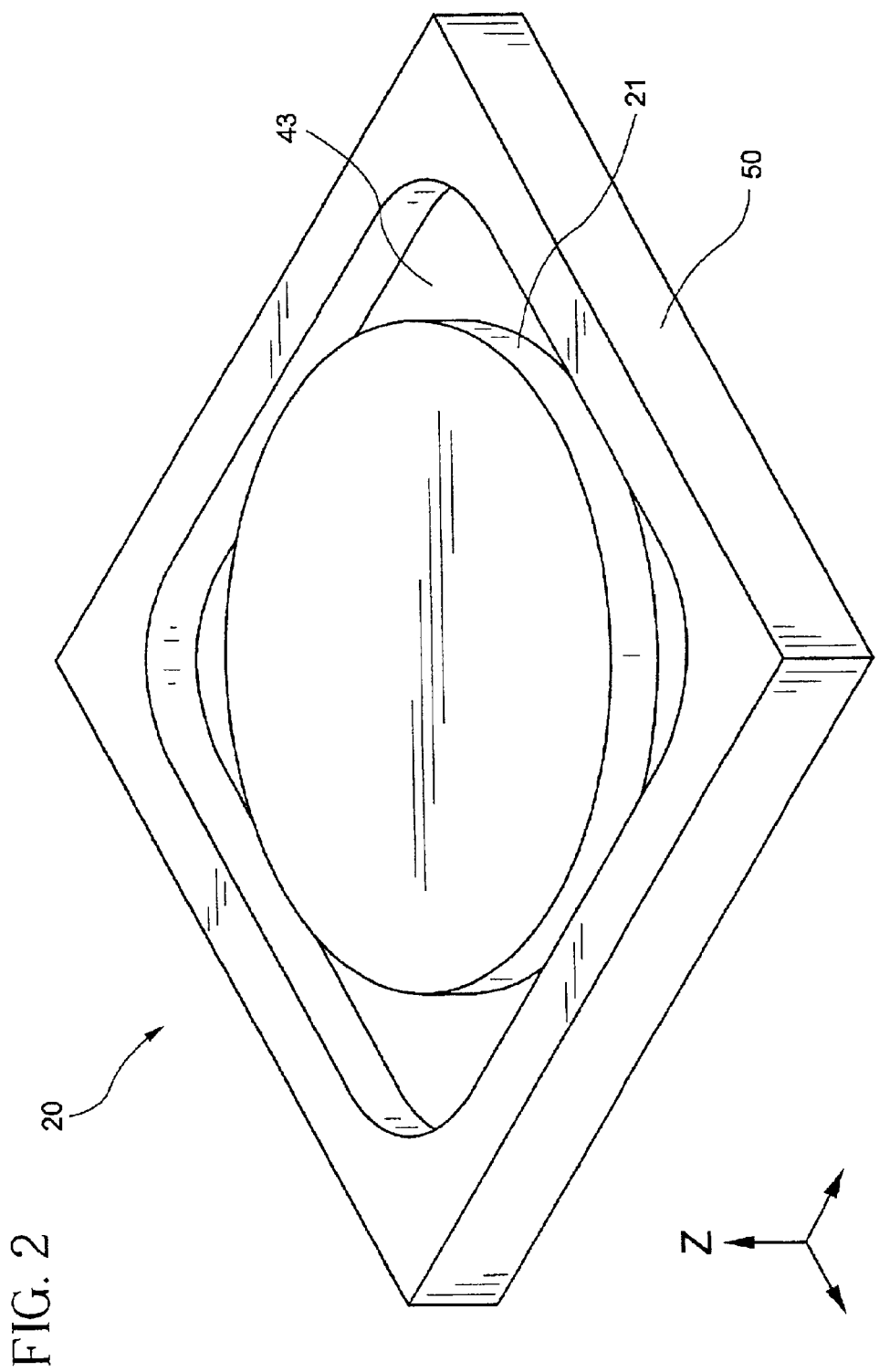
FIG. 2 shows a semiconductor lithography stage in accordance with the invention.

The invention includes a method of making a semiconductor lithography stage. The lithography stages of the invention provide support and holding of components and substrates such as optics, reflective members, mirrors, masks or wafers in a semiconductor manufacturing projection lithography system. Preferably the lithography stage is for receiving a patterned lithography mask or a silicon wafer that is the subject target of the micro-lithography process. Preferably the lithography stage is a EUV lithography stage utilized in an EUV lithography system to receive and hold a patterned lithography mask or a silicon wafer that is the subject target of the micro-lithography process. The method of making the lithography stage includes the steps of providing a Ti doped $SiO_2$ glass powder comprised of a plurality of particles of Ti doped $SiO_2$ glass and providing a binder for binding said Ti doped $SiO_2$ glass particles together. Preferably the glass powder particles are non-crystalline glass particles, most preferably with the glass being silica containing a predetermined amount of $TiO_2$. The method includes depositing a layer of said Ti doped $SiO_2$ glass powder in a confined region to provide an underlying layer and applying said binder to one or more selected regions of said layer of Ti doped $SiO_2$ glass powder to bind at least two of said Ti doped $SiO_2$ glass particles together to form a primitive. The application of binder includes bonding said glass powder together at said one or more selected regions. The method includes depositing an above layer of said Ti doped $SiO_2$ glass powder above said deposited layer and applying said binder to one or more selected regions of said above layer with said binder bonding said glass powder together at said one or more selected regions. The method include repeating the deposition of Ti doped $SiO_2$ glass powder and application of binder to selected regions for a selected number of times to produce a selected number of successive layers with said binder bonding said successive layers together. The method includes removing the unbonded glass powder which is not at said one or more selected regions from the bonded glass powder regions to provide a bonded Ti doped $SiO_2$ glass powder lithography stage structure. The method preferably includes sintering said bonded Ti doped $SiO_2$ glass lithography stage structure into a densified glass lithography stage structure. The bonded Ti doped $SiO_2$ glass powder lithography stage structure is sintered into a glass body which has its structural form. Preferably sintering into a densified glass lithography stage structure includes sintering at a temperature of at least 1100° C., preferably at a temperature no greater than 1700° C., and most preferably at a temperature in the range of 1200 to 1550° C. In a preferred embodiment the glass powder structure is sintered in a vacuum furnace atmosphere. Forming the Ti doped $SiO_2$ glass powder lithography stage structure into a densified glass lithography stage structure preferably includes hot isostatic pressing. Hot isostatic pressing can be done as part of the sintering process when a HIP furnace is utilized for sintering. Hot isostatic pressing is preferably preceded by the use of a heated vacuum atmosphere. Preferably applying said binder includes depositing said binder to form an internal skeletal network frame for the stage. Preferably forming a skeletal network includes forming a web structure with a wall thickness $\leq 2$ mm. In preferred ultrathin wall structure light weight embodiments the wall thickness $\leq 1$ mm, and more preferably a wall thickness $\leq 0.5$ mm. Preferably applying said binder includes depositing said binder to form a lithography wafer receiver surface, preferably with depositing said binder to form a skeletal network frame for said lithography wafer receiver. Preferably depositing said binder to form a lithography wafer receiver includes forming a flat planar surface. In a further embodiment, applying said binder includes depositing said binder to form a lithography mask receiver, preferably with a flat planar surface which has an underlying internal skeletal network frame. In a further embodiment, applying said binder includes depositing said binder to form a flat mirror surface, which can be used in the lithography process to optically detect the position of the stage. In a preferred embodiment the flat mirror surface is machined, polished and formed into a high precision reflective mirror after sintering and densification. Preferably the Ti doped $SiO_2$ glass powder contains 3 to 20 wt. % $TiO_2$, more preferably 5 to 20 wt. % $TiO_2$, and most preferably 5 to 10 wt. % $TiO_2$. In a preferred embodiment, providing a binder comprises providing a mixture of $H_2O$ and Ti doped $SiO_2$ glass soot, most preferably wherein said mixture of water and Ti doped $SiO_2$ glass soot includes ammonia. In an embodiment of the method, providing a Ti doped $SiO_2$ glass powder includes providing a conglomerated Ti doped $SiO_2$ glass powder agglomerate comprised a plurality of cemented together primary glass particles, preferably with the glass powder being dry macro-particles which are glass micro-particles that are bond together with a binder, most preferably wherein said primary glass particles are cemented together with an organic binder, preferably PEG. With such an embodiment providing a binder preferably comprises providing a water binder, said water binder for reactivating said organic binder.

Glass powders with improved packing density and flow behavior are provided by spray drying. Spray drying glass powders can be carried out by first, dispersing Ti doped glass soot in a water/ammonia solution. The solution is then pumped through an atomizing nozzle into a heated chamber to produce typically spherical dried powder agglomerates. The glass powder dried agglomerates flow well and have a relatively high (>25%) bulk density of about 30 to 40%.

Alternatively, binders can be used such as PEG, PVA or PVOH during the spray drying process. Typically, the binder content is minimized to minimize contamination from the organic components.

An alternative to spray drying includes freeze drying. This can be done by spraying an atomized mist of the slurry into liquid nitrogen and then freeze drying the frozen droplets.

Preferably applying said binder to selected regions includes projecting a plurality of binder droplets from a binder deposition head, most preferably with applying said binder to selected regions by ink jet print depositing said binder. Preferably the projected droplets have a diameter$\geq$50 microns, and more preferably the droplets have a diameter of 80±15 microns. Preferably the binder is deposited in select areas by providing relative motion between said binder deposition head and said deposited layer of glass powder and controlling the output of binder droplets. Preferably depositing said Ti doped I glass powder includes depositing with a powder distribution head. Preferably the Ti doped $SiO_2$ glass powder has an average particle size$\geq$10 microns, preferably$\geq$20 microns, and more preferably the Ti doped $SiO_2$ glass powder has an average particle size$\geq$30 microns.

Figure 3:
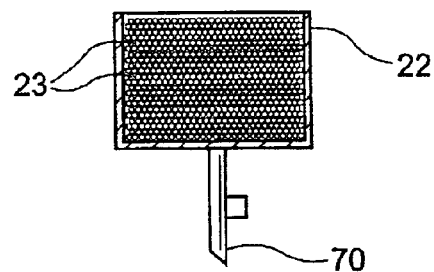
FIGS. 3–15 show methods of making semiconductor lithography structures in accordance with the invention.
Figure 3:
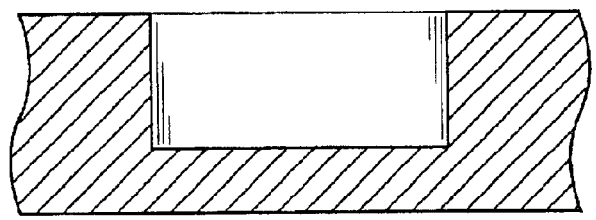
Figure 4:
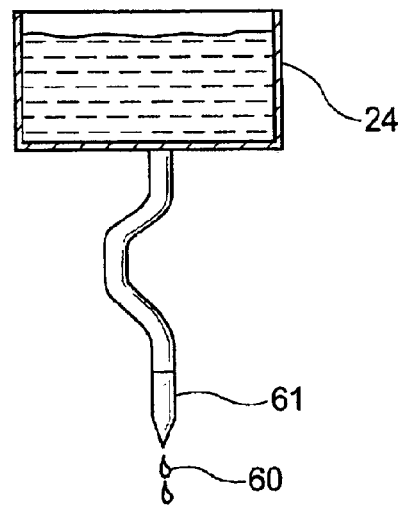
Figure 4:
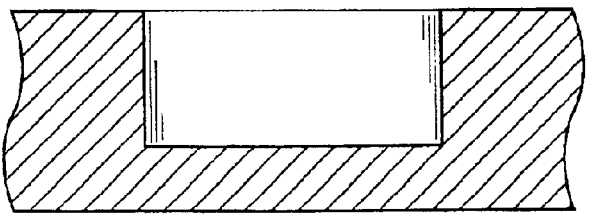
Figure 5:
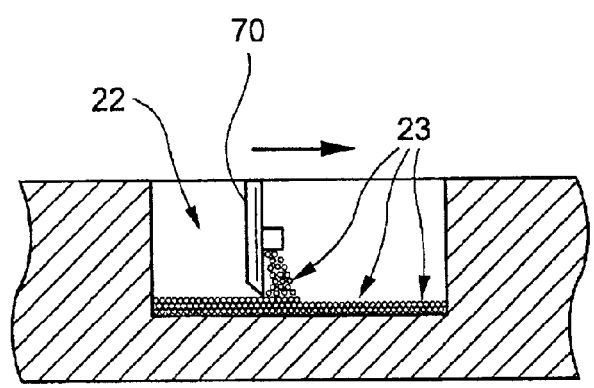
Figure 6:
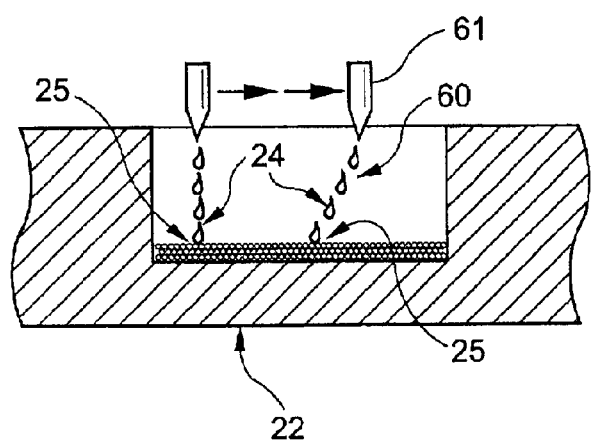
Figure 7:
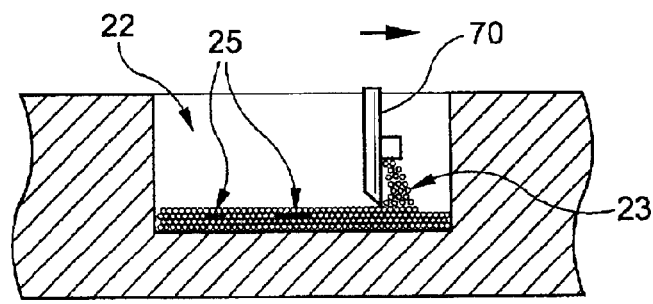
Figure 8:
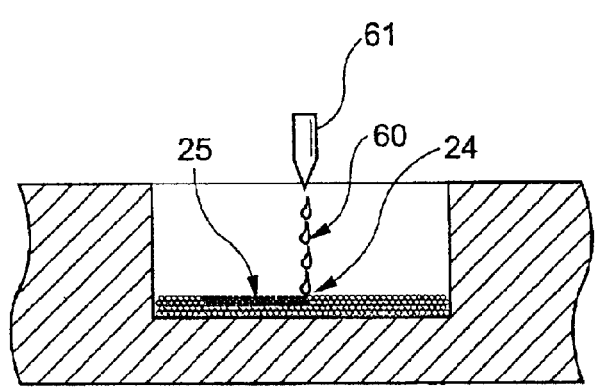
Figure 9:
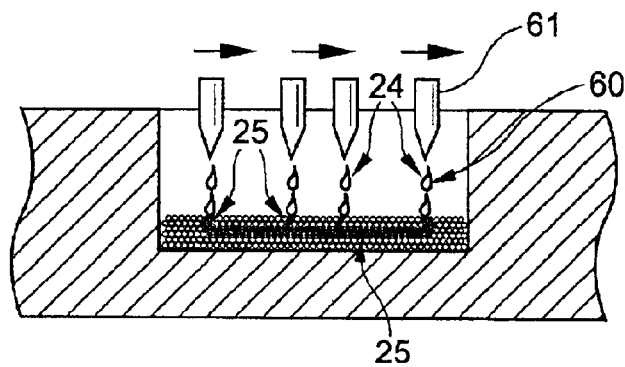
Figure 10:
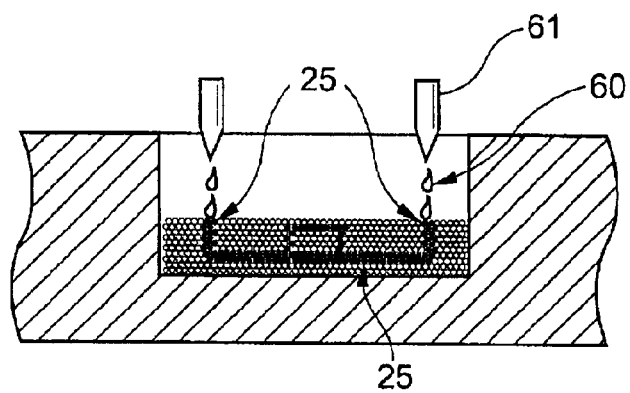
Figure 11:
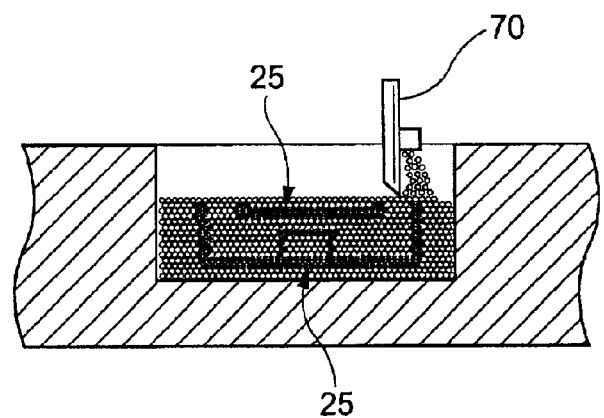
Figure 12:
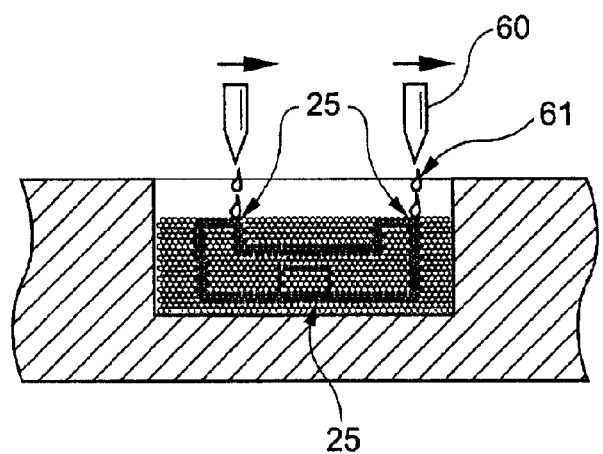
Figure 13:
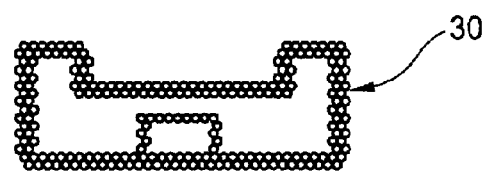
Figure 14:
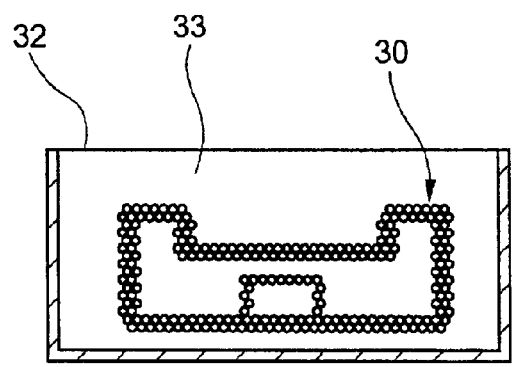
Figure 15:
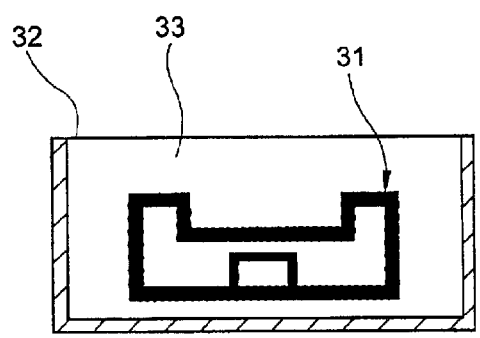
Figure 16:
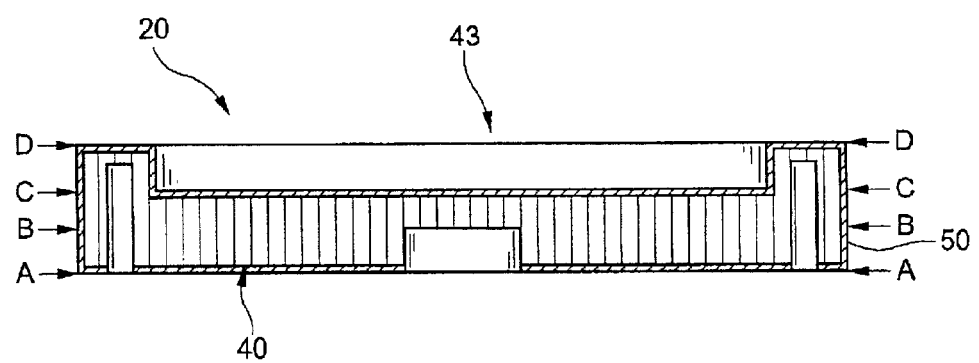
FIG. 16 shows a cross-section view of a semiconductor lithography stage in accordance with the invention.
Figure 16A:
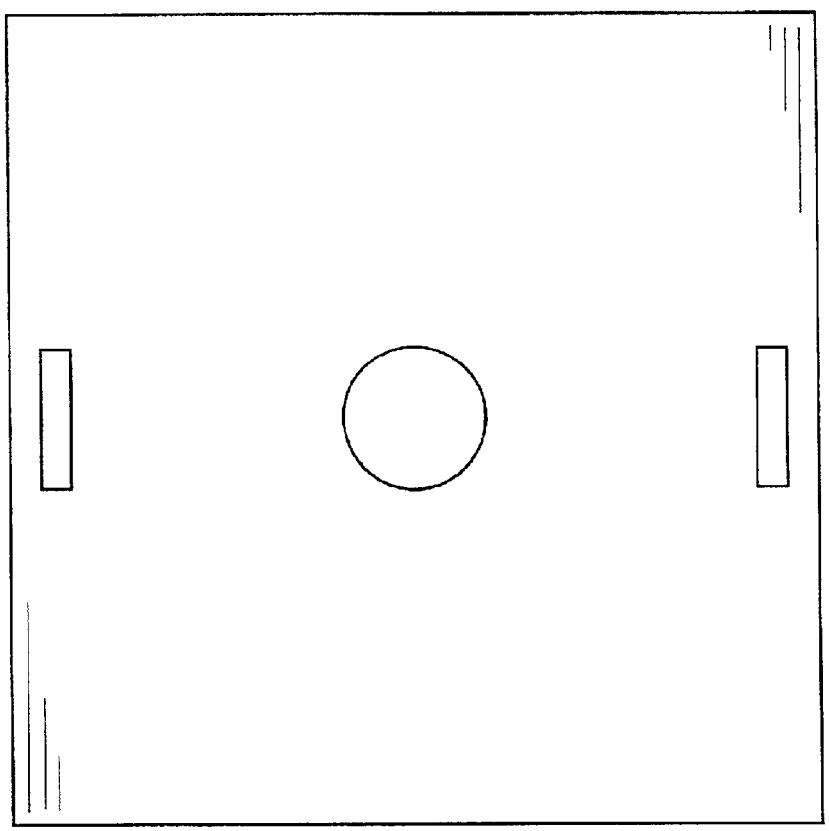
FIG. 16A shows the A—A view of the semiconductor lithography stage of FIG. 16 in accordance with the invention.
Figure 16B:
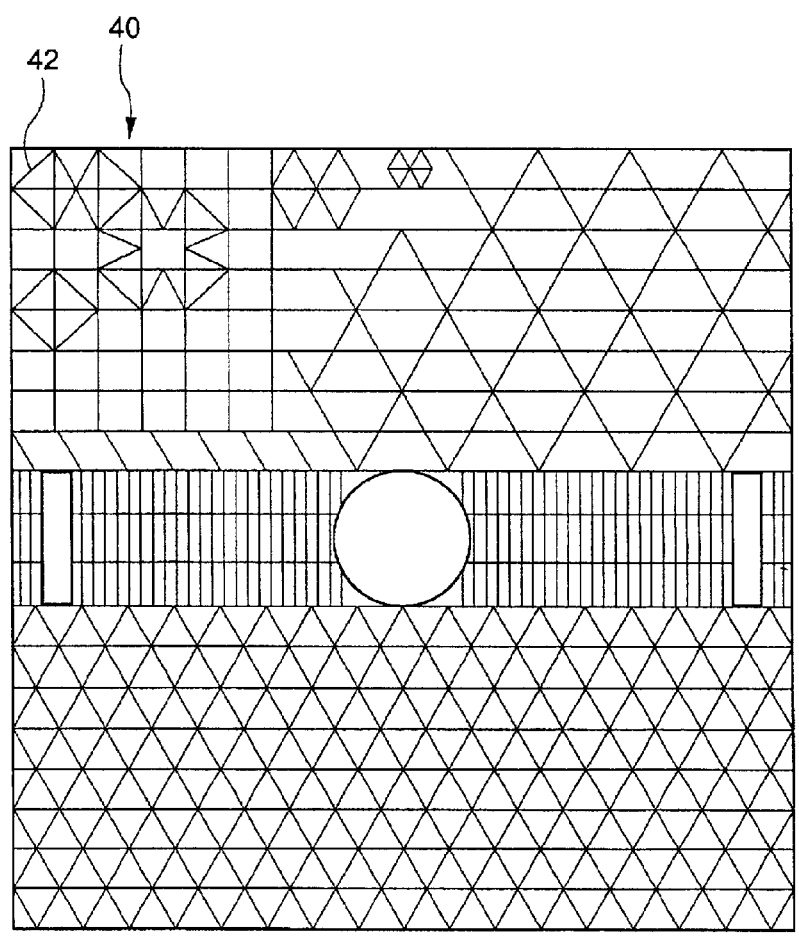
FIG. 16B shows the B—B view of the semiconductor lithography stage of FIG. 16 in accordance with the invention.
Figure 16C:
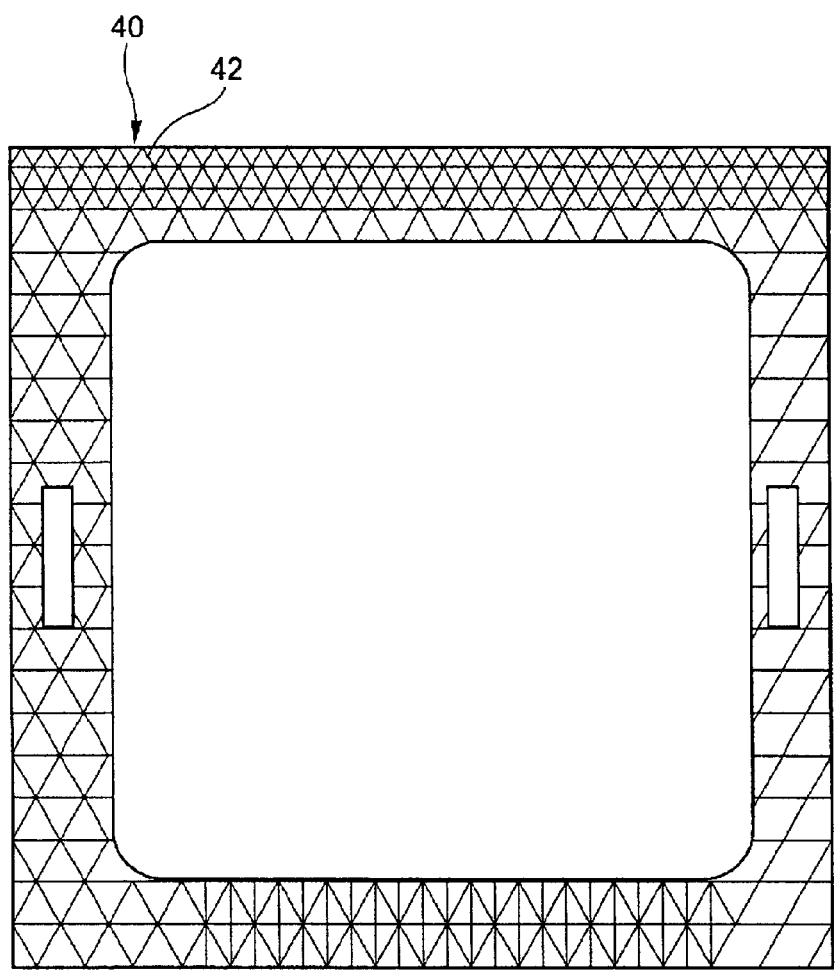
FIG. 16C shows the C—C view of the semiconductor lithography stage of FIG. 16 in accordance with the invention.
Figure 16D:
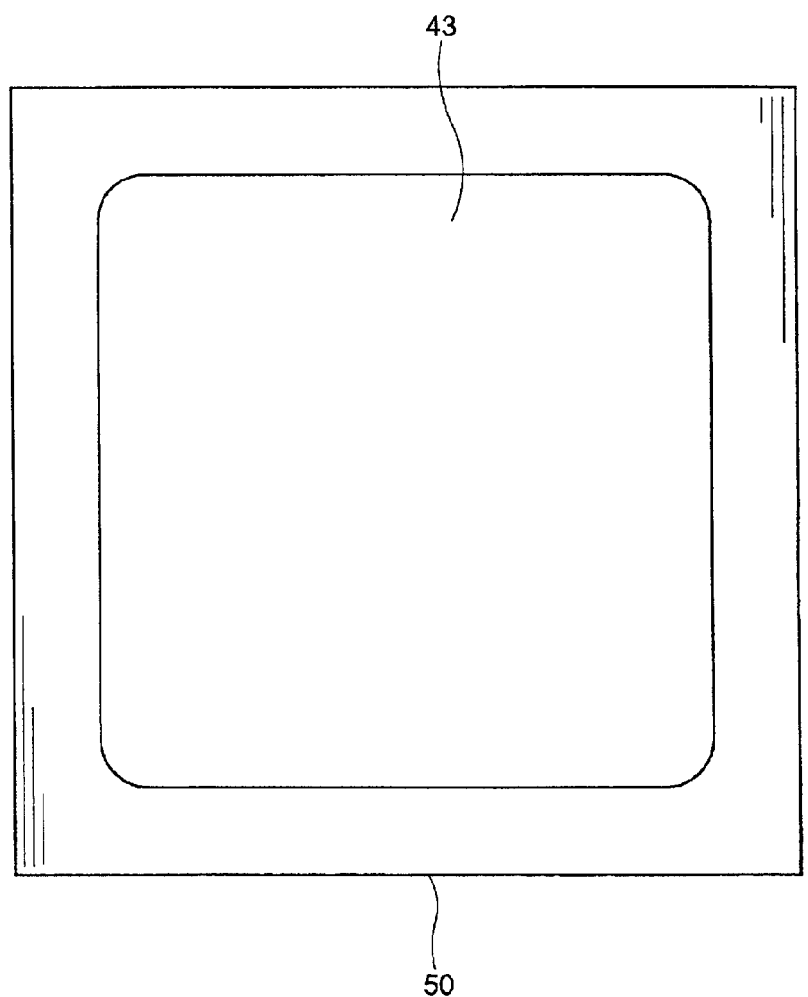
FIG. 16D shows the D—D view of the semiconductor lithography stage of FIG. 16 in accordance with the invention.

Embodiments of the invention are shown in the FIGS. 1–16D, which show a semiconductor lithography stage 20 and a method of making. Preferably the lithography stage 20 is for receiving a patterned lithography mask or a silicon wafer 21 that is the subject target of the micro-lithography process. As shown in FIGS. 3–4 the method of making the lithography stage 20 includes the steps of providing a Ti doped $SiO_2$ glass powder 22 comprised of a plurality of particles 23 of Ti doped $SiO_2$ glass and providing a binder 24 for binding said Ti doped $SiO_2$ glass particles 23 together. Preferably the glass powder particles 23 are non-crystalline glass particles. As shown in FIGS. 5–7, the method includes depositing a layer of said Ti doped $SiO_2$ glass powder 22 in a confined region to provide an underlying layer and applying said binder 24 to one or more selected regions 25 of said layer of Ti doped $SiO_2$ glass powder 22 to bind at least two of said Ti doped $SiO_2$ glass particles 23 together to form a primitive. The application of binder 24 includes bonding said glass powder 22 together at said one or more selected regions 25. The method includes depositing an above layer of said Ti doped $SiO_2$ glass powder 22 above said deposited layer and applying said binder 24 to one or more selected regions 25 of said above layer with said binder bonding said glass powder together at said one or more selected regions. As shown in FIGS. 9–12, the method include repeating the deposition of Ti doped $SiO_2$ glass powder 22 and application of binder 24 to selected regions 25 for a selected number of times to produce a selected number of successive layers with said binder bonding said successive layers together. As shown in FIG. 13, the method includes removing the unbonded glass powder 22 which is not at said one or more selected regions from the bonded glass powder regions 25 to provide a bonded Ti doped $SiO_2$ glass powder lithography stage structure 30. As shown in FIGS. 14–15, the method preferably includes sintering said bonded Ti doped $SiO_2$ glass lithography stage structure 30 into a densified glass lithography stage structure 31. The bonded Ti doped $SiO_2$ glass powder lithography stage structure 30 is sintered into a glass body 31 which has its structural form. Preferably sintering into a densified glass lithography stage structure 31 includes sintering in a glass sintering furnace 32 at a temperature of at least 1100° C., preferably at a temperature no greater than 1700° C., and most preferably at a temperature in the range of 1200 to 1550° C. In a preferred embodiment the glass powder structure is sintered in a vacuum furnace atmosphere 33. Forming the Ti doped $SiO_2$ glass powder lithography stage structure into a densified glass lithography stage structure preferably includes hot isostatic pressing. Hot isostatic pressing can be done as part of the sintering process when a HIP furnace 32 is utilized for sintering. Hot isostatic pressing is preferably preceded by the use of a heated vacuum atmosphere 32. FIG. 16 shows a cross-section view of stage 20, with FIGS. 16A–16D showing horizontal layer cuts through its structure. Preferably applying said binder 24 includes depositing said binder 24 to form an internal skeletal network frame 40 for the stage. Preferably forming a skeletal network 40 includes forming a web structure 42 with a wall thickness$\leq$3 mm. In embodiments the skeletal network structure has wall thickness$\leq$2 mm, more preferably a wall thickness$\leq$1 mm, and more preferably a wall thickness$\leq$0.5 mm. Preferably applying said binder 24 includes depositing said binder 24 to form a lithography wafer receiver surface 43, preferably with depositing said binder to form a skeletal network frame 40 for said lithography wafer receiver. Preferably depositing said binder 24 to form a lithography wafer receiver 43 includes forming a flat planar surface. In a further embodiment, applying said binder 24 includes depositing said binder to form a lithography mask receiver 43, preferably with a flat planar surface which has an underlying internal skeletal network frame 40. In a further embodiment, applying said binder includes depositing said binder to form a flat mirror surface 50, which can be used in the lithography process to optically detect the position of the stage with the flat surface polished and formed into a reflecting mirror after sintering and densification. Forming a flat mirror surface 50 preferably includes forming at least two flat mirror surfaces on at least two sides of the stage, preferably on two nonparrallel adjacent sides for use in optically detecting the position of the stage during use of the lithography system. Preferably the Ti doped $SiO_2$ glass powder 22 contains 3 to 20 wt. % $TiO_2$, more preferably 5 to 20 wt. % $TiO_2$, and most preferably 5 to 10 wt. % $TiO_2$. In a preferred embodiment, providing a binder 24 comprises providing a mixture of $H_2O$ and Ti doped $SiO_2$ glass soot, most preferably wherein said mixture of water and Ti doped $SiO_2$ glass soot includes ammonia. In an embodiment of the method, providing a Ti doped $SiO_2$ glass powder 22 includes providing a conglomerated Ti doped $SiO_2$ glass powder comprised a plurality of cemented together primary glass particles 23, preferably with the glass powder being dry macro-particles 23 which are glass micro-particles that are bond together with a binder, most preferably wherein said primary glass particles are cemented together with an organic binder, preferably PEG. With such an embodiment providing a binder 24 preferably comprises providing a water binder, said water binder for reactivating said organic binder.

Preferably applying said binder 24 to selected regions includes projecting a plurality of binder droplets 60 from a binder deposition head 61, most preferably with applying said binder to selected regions by ink jet print depositing said binder 24. Preferably the projected droplets 60 have a diameter$\geq$50 microns, and more preferably the droplets 60 have a diameter of 80±15 microns. Preferably the binder 24 is deposited in select areas by providing relative motion between said binder deposition head 61 and said deposited layer of glass powder 22 and controlling the output of binder droplets 60. Preferably depositing said Ti doped glass powder 22 includes depositing with a powder distribution head 70. Preferably the Ti doped $SiO_2$ glass powder 22 has an average particle size $\geq 10$ microns, preferably $\geq 20$ microns and more preferably the Ti doped $SiO_2$ glass powder 22 has an average particle size $\geq 30$ microns.

The invention includes making a lithography stage by providing a plurality of glass particles; providing a binder, said binder for binding said glass particles together; depositing a layer of said glass particles in a confined region to provide an underlying layer; applying said binder to one or more selected regions of said layer of glass particles to bind at least two of said glass particles together to form a primitive, said applying binder bonding said glass particles together at said one or more selected regions; depositing an above layer of said glass particles above said deposited layer; applying said binder to one or more selected regions of said above layer with said binder bonding said glass particles together at said one or more selected regions; repeating depositing an above layer and applying a binder a selected number of times to produce a selected number of successive layers with said binder bonding said successive layers together; and removing unbonded glass particles which are not at said one or more selected regions to provide a bonded glass particle lithography stage structure. The bonded glass particle lithography stage structure is heated and sintered into a densified glass lithography stage structure.

The invention includes making an EUV lithography structure by providing a plurality of glass particles; providing a binder, said binder for binding said glass particles together; depositing a layer of said glass particles in a confined region to provide an underlying layer; applying said binder to one or more selected regions of said layer of glass particles to bind at least two of said glass particles together to form a primitive, said applying binder bonding said glass particles together at said one or more selected regions; depositing an above layer of said glass particles above said deposited layer; applying said binder to one or more selected regions of said above layer with said binder bonding said glass particles together at said one or more selected regions; repeating depositing an above layer and applying a binder a selected number of times to produce a selected number of successive layers with said binder bonding said successive layers together; and removing unbonded glass particles which are not at said one or more selected regions to provide a bonded glass particle EUV lithography structure. The bonded glass particle EUV lithography structure is heated and densified into a densified EUV lithography structure.

In an embodiment of the invention, providing glass particles comprises providing a $TiO_2$ containing silica glass. In an alternative preferred embodiment the glass particles are a high purity fused silica glass. In a preferred embodiment, the Ti doped $SiO_2$ glass particles contains from 5 to 10 wt. % $TiO_2$, most preferably with the $TiO_2$ silica glass having an OH content>100 ppm OH wt., more preferably>500 ppm OH wt, preferably with the silica glass being a glass which consists essentially of $SiO_2$ and $TiO_2$. In a particularly preferred embodiment the $TiO_2$ silicon dioxide silica glass particles contains from 6 to 8 wt. %, more preferably form 6.5 to 7.5 wt. %, and most preferably about 7 wt. % $TiO_2$. In an embodiment the glass particles are a batch melted glass with <99% $SiO_2$. In an alternative embodiment the $TiO_2$ containing silica glass particles are an uncerammed glass-ceramic precursor glass. In an embodiment providing the glass particles preferably includes providing an uncerammed glass-ceramic precursor glass. In a preferred embodiment the uncerammed glass-ceramic precursor glass particles are an aluminosilicate glass. In an embodiment the uncerammed glass-ceramic precursor glass particles are a lithium aluminosilicate glass. In an embodiment the uncerammed glass-ceramic precursor glass particles contain $TiO_2$. In an embodiment the uncerammed glass-ceramic precursor glass particles contain $TiO_2$ and $ZrO_2$. In a preferred embodiment the glass-ceramic precursor glass is a lithium aluminosilicate glass which contains $TiO_2$. In a preferred embodiment the glass-ceramic precursor glass is a lithium aluminosilicate glass which is cerammable into a glass-ceramic with a low average CTE (0–1000° C.) less than about $20 \times 10^{-7}$/° C., preferably comprised of 3–8 wt. % $Li_2O$, 18–33 wt. % $Al_2O_3$, 55–75 wt. % $SiO_2$, and 3–5 wt. % $TiO_2 + ZrO_2$. In a preferred embodiment the glass-ceramic precursor glass is a lithium aluminosilicate glass which is cerammable into a glass-ceramic with a mean coefficient of linear thermal expansion of $0 \pm 0.10 \times 10^{-6}$/K (0–50° C.), more preferably mean coefficient of linear thermal expansion of $0 \pm 0.05 \times 10^{-6}$/K (0–50° C.), and most preferably mean coefficient of linear thermal expansion of $0 \pm 0.02 \times 10^{-6}$/K (0–50° C.). Preferably the glass-ceramic precursor lithium aluminosilicate glass which is cerammable into a glass-ceramic with a mean coefficient of linear thermal expansion of $0 \pm 0.10 \times 10^{-6}$/K (0–50° C.) has a weight percent composition of about $55.5(\pm 1)$ wt. % $SiO_2$, $25.3(\pm 1)$ wt. % $Al_2O_3$, $3.7(\pm 1)$ wt. % $Li_2O$, $1(\pm 1)$ wt. % MgO, $1.4(\pm 1)$ wt. % ZnO, $7.9(\pm 1)$ wt. % $P_2O_5$, $0.5(\pm 0.5)$ wt. % $Na_2O$, $0.03$ ($\pm 0.03$) wt. % $Fe_2O_3$, $2.3(\pm 1)$ wt. % $TiO_2$, $1.9(\pm 1)$ wt. % $ZrO_2$, $0.5(\pm 0.5)$ wt. % $As_2O_3$. When the glass particles are a glass-ceramic precursor glass the heating and densifying into a densified structure preferably includes ceramming the glass into its glass-ceramic state with a ceramming heating cooling schedule for crystal growth.

It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

What is claimed is:

1. A method of making a lithography stage structure, said method comprising the following steps:
    (a) providing a Ti doped $SiO_2$ glass powder comprised of a plurality of particles of Ti doped $SiO_2$ glass;
    (b) providing a binder, said binder for binding said Ti doped $SiO_2$ glass particles together;
    (c) depositing a layer of said Ti doped $SiO_2$ glass powder in a confined region to provide an underlying layer;
    (d) applying said binder to one or more selected regions of said layer of Ti doped $SiO_2$ glass powder to bind at least two of said Ti doped $SiO_2$ glass particles together to form a primitive, said applying binder bonding said glass powder together at said one or more selected regions;
    (e) depositing an above layer of said Ti doped $SiO_2$ glass powder above said deposited layer;
    (f) applying said binder to one or more selected regions of said above layer with said binder bonding said glass powder together at said one or more selected regions;
    (g) repeating steps (e) and (t) a selected number of times to produce a selected number of successive layers with said binder bonding said successive layers together;
    (h) removing unbonded glass powder which is not at said one or more selected regions to provide a bonded Ti doped $SiO_2$ glass powder lithography stage structure.

2. A method as claimed in claim 1, further including sintering said bonded Ti doped $SiO_2$ glass lithography stage structure into a densified glass lithography stage structure.

3. A method as claimed in claim 2 wherein sintering into a densified glass lithography stage structure includes sintering at a temperature of at least 1100° C.

4. A method as claimed in claim 2 wherein sintering into a densified glass lithography stage structure includes hot isostatic pressing.

5. A method as claimed in claim 2 wherein sintering includes sintering in a vacuum.

6. A method as claimed in claim 1, wherein applying said binder includes depositing said binder to form a skeletal network.

7. A method as claimed in claim 6, wherein forming a skeletal network includes forming a web structure with a wall thickness 3 mm.

8. A method as claimed in claim 1, wherein applying said binder includes depositing said binder to form a lithography wafer receiver.

9. A method as claimed in claim 8 wherein depositing said binder to form a lithography wafer receiver includes forming a flat planar surface.

10. A method as claimed in claim 9 further including depositing said binder to form a skeletal network frame for said lithography wafer receiver.

11. A method as claimed in claim 9 wherein applying said binder includes depositing said binder to form a lithography mask receiver.

12. A method as claimed in claim 1 wherein applying said binder includes depositing said binder to form a mirror surface.

13. A method as claimed in claim 1 wherein said Ti doped $SiO_2$ glass powder contains 3 to 20 wt. % $TiO_2$.

14. A method as claimed in claim 1, wherein providing a binder comprises providing a mixture of $H_2O$ and Ti doped $SiO_2$ glass soot.

15. A method as claimed in claim 14, wherein said mixture of $H_2O$ and Ti doped $SiO_2$ glass soot includes ammonia.

16. A method as claimed in claim 1 wherein providing a Ti doped $SiO_2$ glass powder includes providing a conglomerated Ti doped $SiO_2$ glass powder comprised a plurality of cemented together primary glass particles.

17. A method as claimed in claim 16 wherein said primary glass particles are cemented together with an organic binder.

18. A method as claimed in claim 17 wherein providing a binder comprises providing a water binder, said water binder for reactivating said organic binder.

19. A method as claimed in claim 1, wherein applying said binder to selected regions includes projecting a plurality of binder droplets from a binder deposition head.

20. A method as claimed in claim 19 further including providing relative motion between said binder deposition head and said deposited layer of glass powder.

21. A method as claimed in claim 1 wherein applying said binder to selected regions includes ink jet print depositing said binder.

22. A method as claimed in claim 1 wherein depositing said Ti doped glass powder includes depositing with a powder distribution head.

23. A method as claimed in claim 1 wherein said Ti doped $SiO_2$ glass powder has an average particle size 10 microns.

24. A method as claimed in claim 1 wherein said Ti doped $SiO_2$ glass powder has an average particle size $\geq$ 20 microns.

25. A method of making a lithography stage structure, said method comprising the following steps:

(a) providing a plurality of glass particles;

(b) providing a binder, said binder for binding said glass particles together;

(c) depositing a layer of said glass particles in a confined region to provide an underlying layer;

(d) applying said binder to one or more selected regions of said layer of glass particles to bind at least two of said glass particles together to form a primitive, said applying binder bonding said glass particles together at said one or more selected regions;

(e) depositing an above layer of said glass particles above said deposited layer;

(f) applying said binder to one or more selected regions of said above layer with said binder bonding said glass particles together at said one or more selected regions;

(g) repeating steps (e) and (f) a selected number of times to produce a selected number of successive layers with said binder bonding said successive layers together;

removing unbonded glass particles which are not at said one or more selected regions to provide a bonded glass particle lithography stage structure.

26. A method as claimed in claim 25, further including sintering said bonded glass particle lithography stage structure into a densified glass lithography stage structure.

27. A method as claimed in claim 26 wherein sintering into a densified glass lithography stage structure includes sintering at a temperature of at least 1100° C.

28. A method as claimed in claim 26 wherein sintering into a densified glass lithography stage structure includes hot isostatic pressing.

29. A method of making an EUV lithography structure, said method comprising the following steps:

(a) providing a plurality of glass particles;

(b) providing a binder, said binder for binding said glass particles together;

(c) depositing a layer of said glass particles in a confined region to provide an underlying layer;

(d) applying said binder to one or more selected regions of said layer of glass particles to bind at least two of said glass particles together to form a primitive, said applying binder bonding said glass particles together at said one or more selected regions;

(e) depositing an above layer of said glass particles above said deposited layer;

(f) applying said binder to one or more selected regions of said above layer with said binder bonding said glass particles together at said one or more selected regions;

(g) repeating steps (e) and (f) a selected number of times to produce a selected number of successive layers with said binder bonding said successive layers together;

(h) removing unbonded glass particles which are not at said one or more selected regions to provide a bonded glass particle EUV lithography structure.

30. A method as claimed in claim 29, further including sintering said bonded glass particle lithography structure into a densified EUV lithography structure.

31. A method as claimed in claim 30 wherein sintering into a densified EUV lithography structure includes sintering at a temperature of at least 1100° C.

32. A method as claimed in claim 30 wherein sintering into a densified EUV lithography structure includes hot isostatic pressing.

* * * * *